United States Patent [19]

Luc et al.

[11] Patent Number: 4,668,581
[45] Date of Patent: May 26, 1987

[54] BONDING ELECTRICAL CONDUCTORS AND BONDED PRODUCTS

[75] Inventors: Penelope J. V. Luc, Great Bookham; Patrick B. Ryan, London, both of England

[73] Assignee: Luc Technologies Limited, London, England

[21] Appl. No.: 693,166

[22] Filed: Jan. 22, 1985

[30] Foreign Application Priority Data

Jan. 25, 1984 [GB] United Kingdom ................ 8401963
Jan. 12, 1985 [GB] United Kingdom ................ 8500794

[51] Int. Cl.⁴ ...................... B23K 20/12; H01R 43/02
[52] U.S. Cl. ................................. 428/620; 29/569 R; 29/843; 29/877; 29/882; 174/117 A; 156/73.5; 156/303.1; 156/309.6; 228/2; 228/44.7; 228/112; 228/179; 228/265; 357/69; 361/403
[58] Field of Search .................. 156/73.1, 73.5, 303.1, 156/309.6; 428/620; 29/569 R, 576 R, 576 J, 845, 738, 577 R, 577 C, 874, 876, 877, 882, 843, 844; 228/110, 1.1, 112, 2, 123, 265, 179, 180.1, 44.7, 904, 4.6; 174/117 A, ; 361/400, 403; 357/69

[56] References Cited

U.S. PATENT DOCUMENTS

| | | | |
|---|---|---|---|
| 3,067,488 | 12/1962 | Bennett et al. | 228/180.1 |
| 3,252,203 | 5/1966 | Alberts et al. | 228/179 |
| 3,418,196 | 12/1968 | Luc | 156/73.1 |
| 3,615,946 | 10/1971 | Palmer | 156/303.1 |
| 3,733,685 | 5/1973 | Kauppila | 228/110 |
| 3,831,262 | 8/1974 | Luc | 228/2 |
| 3,899,377 | 8/1975 | Luc | 156/73.5 |
| 3,949,896 | 4/1976 | Luc | 228/112 |
| 3,972,755 | 8/1976 | Misfeldt | 156/303.1 |
| 4,106,167 | 8/1978 | Luc | 228/114 |
| 4,144,110 | 3/1979 | Luc | 156/73.5 |
| 4,355,199 | 10/1982 | Luc | 174/68.5 |
| 4,480,779 | 11/1984 | Luc | 228/112 |

FOREIGN PATENT DOCUMENTS

| | | | |
|---|---|---|---|
| 69824 | 1/1983 | European Pat. Off. | 156/303.1 |
| 102728 | 3/1984 | European Pat. Off. | |

Primary Examiner—Michael Wityshyn
Attorney, Agent, or Firm—Kenyon & Kenyon

[57] ABSTRACT

Bonds between a contact area of a circuit of a semiconductor and a conductor are formed by applying a rotating tool to an opposed surface of the conductor or to an intervening material superposed on it. The conductor may be laminated to one or more layers of insulant material and when that material is for example polyester, the bond may be formed without prior removal of the insulant from between the contact area and the conductor; it is displaced by the effect of the tool. The areas and conductors may be in an array and the tool be brought across the members of the array in succession.

16 Claims, 12 Drawing Figures

BONDING ELECTRICAL CONDUCTORS AND BONDED PRODUCTS

FIELD OF THE INVENTION

The present invention relates to the bonding of conductors to semi-conductor material. It also relates to a new and improved method of electrically interconnecting a semi-conductor device by bonding and to a bonded assembly comprising conductors bonded to semi-conductor material and to a bonded assembly comprising conductors bonded to a semi-conductor device to electrically interconnect it.

BACKGROUND OF THE INVENTION

In the majority of semi-conductor devices a very critical, time consuming and therefore expensive stage during manufacture is the connection of the device to the external circuit or lead frame which enables it to be used or packaged in the desired manner. This necessitates bonding to the semi-conductor on the one hand and to the external circuit or lead frame on the other. There are two main methods of making these connections, being wire bonding and tape automated bonding (T.A.B.). While T.A.B. is faster than wire bonding, it is in general only economic for very large quantities and is limited in its applications to single chip devices for digital watches or chip bonding prior to plastic encapsulation packaging.

Wire bonding, which requires very fine wire made to exacting dimensional and chemical tolerances, is also expensive. Both methods require significant areas of the expensive device material to be set aside as bonding areas or "pads".

Both techniques are described by Johnson K. I. in "Hybrid Circuits" (No. 2, Spring 1983, pp 5–11) and in "The Fourth Electronic Revolution" published by Financial Times Business Information Ltd., pp 76–85.

SUMMARY OF THE INVENTION

The present invention relates to the use of our welding process, substantially as described in our U.K. Pat. Nos. 1379513, 1380558 and 1385473 and our European patent application No. 83-304258-3, to bond electrical interconnection elements or conductors to specific areas of a circuit of a semi-conductor, for example an integrated circuit contained on a semi-conductor material or device such as a silicon chip.

In particular this invention relates to the interconnection of an area of a circuit of a semi-conductor device to another area or areas of the same device or to a circuit external to the device by bonding the conductor of an interconnection element to the appropriate areas according to our process.

The invention also relates to a method of bonding the conductors of an interconnection element to a semi-conductor device, and if required to the bonding of outer leads or elements of these conductors to a further external circuit.

The invention is characterised in that the bonding of the interconnection is made by welding according to our friction seam welding process which comprises the use of a rotating tool such as a wheel, rotating at high speed (e.g. above 3,000, more preferably above 10,000 rpm and even more preferably 25,000 rpm or more) which is brought into contact with a working surface of an assembly of the materials to be joined, for example, it may touch the top surface of a thin conductor which is positioned above a contact area on a semi-conductor device such as a silicon chip, resulting in a weld between the conductor and the contact area. Alternatively the working surface may be the surface of at least one material interposed between the wheel and the assembly to be bonded and hereinafter referred to as an "intervening material". This material may be a polytetrafluoroethylene coated cloth such as a glass cloth, a metal foil, a polyimide film, a cellulosic material such as paper or a combination of these. An intervening material may also be coated with or comprise a suitable release agent. The welding is nevertheless accomplished through these layers, the energy being generated in situ by contact of the friction wheel with the assembly and in the area where the conductors of the circuit element and the metallised or non-metallised areas of the semi-conductor are joined a true metallurgical bond can be achieved.

To produce welds continuously, for example between an array of conductors comprised in an interconnecting element and an array of contact pads on a semi-conductor device, the wheel may be moved over the assembly or the assembly may be moved beneath the wheel at speeds of up to 700 mm/sec each conductor being welded in turn to the corresponding contact pad as the wheel and the assembly move in line relative to each other at high speed. By the use of a small wheel with a very small contact area, welds less than 100 $\mu$m wide can be made so that conductors of the interconnection element and the pads of the semi-conductor can have a pitch as close as 50 $\mu$m without short circuiting occurring as a result of welding. At a linear welding speed of 200 mm second this will mean that at that pitch four connections can be welded in one millisecond. The process may also be used to weld such connections discontinuously with, for instance, spot welds or circular welds.

One object of this invention is concerned with improvements to current methods of making electrical connections to circuits or integrated circuits contained on a semi-conductor material or device for example on a silicon chip.

Another object of the invention is to provide an assembly with novel characteristics the elements of which include:

(i) a semi conductor device (ii) conductive interconnection elements in particular formed from a metal foil/plastic film laminate bonded to and electrically interconnecting areas of the circuitry of the semi-conductor device to other areas of the same device and/or to elements of an external circuit by use of our welding process and, optionally, (iii) a circuit external to the semi-conductor device and the conductive interconnection elements and to which the outer leads of the conductive interconnection element are electrically connected and which may form part of the semi-conductor substrate, carrier or package, or be a connector or power source.

The semi-conductor device may be of any suitable material and is generally of silicon but may also be of gallium arsenide or the like and may be of any type for example of bipolar or n or p type silicon. It may also be of any shape or size, for example, it may comprise at least one diced section or chip of a larger wafer or may comprise a complete wafer of semi-conductor material. For the sake of convenience it will hereinafter be referred to as a "chip".

The semi-conductor device may be a single active or passive circuit such as a transistor, a resistor or a capacitor or it may comprise a plurality of such components forming an integrated circuit such as a memory device, a logic gate array or other circuit, and may also represent or form part of any type of solid state device or a specific unit or technology. Such a component, circuit or circuits contained on a single piece of semi-conductor conductor material will hereinafter be referred to as an "I.C."

All such circuits or components will be provided with contact areas or "pads" to which the conductive interconnection elements are to be welded. These contact areas may be of any shape or size and may be metallised or non-metallised, and are preferably designed in an aligned relationship or array. These areas will hereinafter be referred to as "pads". If the pads are metallised the metallisation layer may be of aluminium or gold or of any other appropriate metal or combination of metals.

The pads of the circuit contained on the chip are generally formed by the deposition of a layer of a metal onto the surface of the chip, and subsequent etching away of the metal layer to the desired final pattern.

The interconnection element comprising the conductors and hereinafter referred to as the "interconnection element" or the "conductor(s)" may be welded to the metallised pads on the surface of the silicon but according to the present invention conductors may also be welded directly to un-metallised pads, i.e. directly to the semi-conductor material. The form of the conductors may be of a wire, or of a rectangular cross section as in the overhanging beam conductors which form the tape mounted lead-frame used in the conventional T.A.B. process. As in the T.A.B. method, either the contact pads on the semi-conductor device or the metal beams in the lead-frame may be provided the metal bumps to help reduce the risk of unintentional connection to other areas of the semi-conductor device such as a silicon chip. However, whereas with T.A.B. bonding processes it is necessary to create a hole, corresponding to the silicon chip, in the support tape which carries the lead-frame such that the conducting beams overhang the edge of the hole, according to the present invention such a hole is not necessary.

Alternatively in a preferred method and assembly the conductors which are generally of metal may comprise one layer of a laminate and the other layers may be films of insulators such as a polyimide or a thermoplastic such as polyester, polyethylene or another material or may comprise alternating layers of metal conductors and insulators. The metal or metallisation layer deposited on or laminated to a plastic film is subsequently processed, for example, by etching to produce the desired circuit pattern. Alternatively the laminate may consist of a layer of metal foil etched or stamped in the form of the required circuit which is supported on or between insulating film as described above.

The conductors which are generally of metal may be made from any suitable metal foil or metallized layer including nickel, silver or gold coated copper or nickel or any other metal or metal alloy combinations, but they are preferably of copper or aluminium representing cheaper conductor materials. The thickness of foil in a laminated interconnection element is preferably between 6 $\mu$m and 25 $\mu$m and the thickness of a single insulating layer between 2.5 $\mu$m–25 $\mu$m so that the total laminate thickness is between 8.5 $\mu$m and 50 $\mu$m.

The conductors of the interconnection element may be in the form of tracks or of a specific circuit either matching or complimentary to the circuitry of the semi-conductor device in combination with which once bonded they may perform a specific function or they may be part of a pre-existing larger electrical circuit into which the semi-conductor is incorporated by the welding process.

The conductors supported by or laminated to a thermoplastic film or polyimide film may be placed in direct contact with the corresponding integrated circuit pad prior to bonding which may take place through the supporting thermoplastic or polyimide film. The bonding may also take place through a suitable intervening layer such as a metal foil.

Alternatively, in a preferred method where a thermoplastic film supports the conductors, or they are comprised within a laminate of which one outer layer is a thermoplastic, the conductor tracks are positioned immediately above the corresponding pads of the integrated circuit on the chip in such a way that the thermoplastic support film on one side of the laminate is in between the conductors and the pads. According to this invention, the bonding process will cause the thermoplastic film to flow away from between the contact pads on the chip and the conductors, and welds will be formed between these contact pads and the corresponding conductors resulting in good electrical connections.

The circuit to which outer leads of the conductor tracks of the interconnection element are connected or welded according to our process can be tracks of a circuit on a printed circuit board (P.C.B.) or the tracks of a hybrid circuit deposited by thin or thick film techniques on a ceramic or other substrate. If the chip is packaged, the conductors of the interconnection element can be connected or welded to the conductors of the package or lead frame. The conductors of the interconnection element can also be connected to the conductors of one or more interconnection elements according to this invention or to an external circuit. More than one semi conductor device can be connected to the conductors of the same interconnection element according to this invention.

DESCRIPTION OF THE EMBODIMENTS

Example 1

Figure 1:
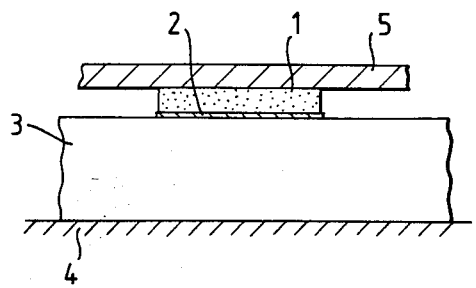
FIG. 1 is a side sectional view of an unlaminated conductor juxtaposed with a contact area.

(a) In this example aluminium conductors are welded to the metallised contact pads of an I.C. on a silicon chip. The aluminium conductors 1 (FIG. 1), are positioned directly above the corresponding metallised contact pads 2 in the I.C. contained on the silicon chip 3, and are held firmly together on a smooth hard surface 4 with the aluminum conductors uppermost.

The rectangular cross section of the aluminium conductors at the point where they are to be welded to the contact pads on the silicon chip are 25 μm wide and 15 μm thick. The aluminium contact pads on the chip may be 25 μm×25 μm square.

A piece of intervening material such as polytetrafluoroethylene coated glass cloth 5 is placed over the aluminium conductors and a smooth hard, highly polished wheel, having a diameter of 12 mm and thickness at its circumference of approximately 25 μm is rotated at approximately 60,000 rpm. The wheel may be of metal such as hardened steel or other suitable material.

The wheel is brought into contact with the top surface of the intervening layer and moved relative to the assembly at a linear speed of approximately 250 mm sec. passing in a line directly over each juxtaposed conductor and contact pad in turn, causing them to be welded to each other. The weld area is approximately 25 μm².

With contact pads on the silicon 0.25 mm apart connections are welded at a rate of 2 ms per contact, much faster than the bonding speeds of any other known process.

(b) This example is the same in all respects as example 1(a) except that there is no metallisation layer on the contact pads of the silicon chip. With a suitably adjusted traverse speed (for example 100 mm/sec) sound electrical connections are obtained between the aluminium conductors and the silicon chip.

Example 2

Figure 2:
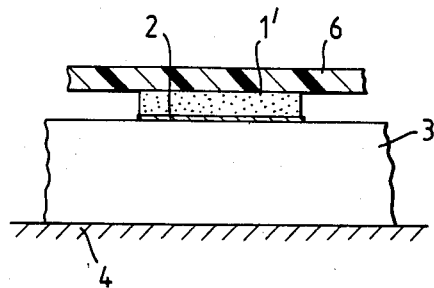
FIG. 2 is a side sectional view of a laminated conductor juxtaposed with a contact area.

(a) In this example the copper conductors of an interconnection element which are wholly supported on a polyimide tape are welded to metallised contact areas on an I.C. contained on a semi-conductor material or device such as a silicon chip. The conductors 1' (FIG. 2) may be made by laminating a thin copper foil to a thin film of a polyimide 6 such as KAPTON (Trade Mark Du Pont de Nemours for a polyimide) and subsequently etching the foil to produce the desired circuit pattern which can then if required be coated with a thin layer of gold. The copper foil and the Kapton film may both be approximately 15 μm thick, and the width of the copper conductors after etching may be 25 μm.

The Kapton film with the copper conductors is positioned in such a way that the tracks of the conductors lie directly above the corresponding metallised contact pads 2 on the semi-conductor 3, with the copper circuit side of the laminate directly in contact with the semi-conductor device. The aluminised contact pads on the semi-conductor device may be 25 μm×25 μm square.

The complete assembly is firmly held on a smooth hard surface 4 with the Kapton uppermost while a 35 mm diameter wheel rotating at approx 25,000 rpm contacts the Kapton and passes over the area corresponding to that of each contact pad in turn at a traversing speed of approximately 200 mm/sec. As the wheel passes over each conductor it is welded to the metallised surface of the pad beneath, resulting in a sound electrical joint.

(b) If there is no metallisation layer on the pads of the silicon chip the traversing speed is adjusted to 100 mm/sec and sound electrical connections will be produced between the aluminium conductors and the silicon chip.

Example 3

In this example an interconnection element comprises aluminium conductors of a rectangular cross section 25 μm wide and 15 μm thick, sandwiched between the polyimide and the polyester layers of the laminate which in this example are each 10 μm thick. The conductors of the element are welded to the metallised circuit pads of an I.C. on a semi-conductor device such as a silicon chip. The metallised pads on the silicon chip may be of aluminium or other suitable metal, and may be 25 μm×25 μm squares.

Figure 3A:
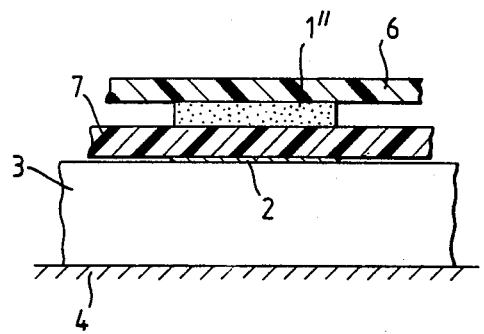
FIGS. 3(a) and (b), 4(a) and (b) and 5(a) and (b) are side sectional views of respective sandwich laminated conductors before and after bonding to contact areas.
Figure 3B:
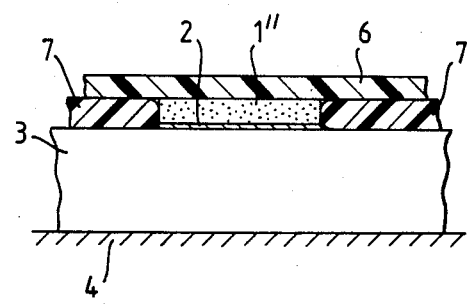

The interconnection element is positioned above the I.C. on the silicon chip 3 (FIG. 3 (a)) such that the polyester face 7 is in contact with the metallised contact pads 2 and such that the conductors 1" in the interconnection element are directly above the corresponding contact pads. The I.C. and interconnection element are firmly held on a smooth hard surface 4 such that the polyimide surface 6 is uppermost.

A wheel similar to that used in Example 1, rotating at a speed of approximately 60,000 rpm is brought into contact with the polyimide surface and is moved over it at a linear speed of approximately 200 mm/sec passing in turn directly above each metallised contact pad on the I.C. This causes the polyester to flow away from between the metallised contact pads and the conductors of the interconnection element (FIG. 3 (b)), welding each contact pad to the corresponding conductor which is protected in all directions by polyester and/or polyimide.

Example 4

Figure 4A:
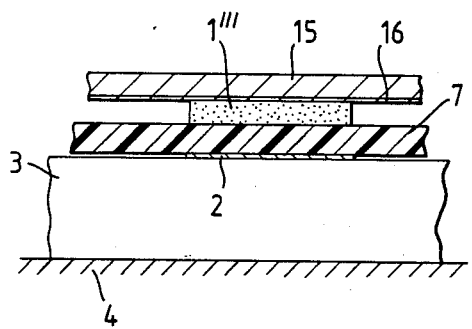
Figure 4B:
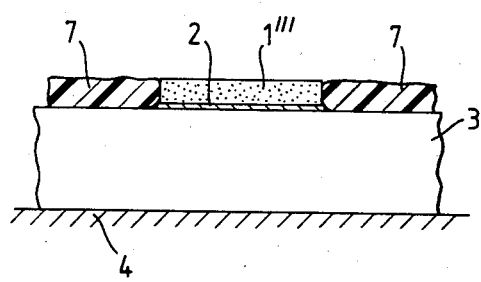

In this example, metal conductor 1''' laminated to a polyester film 7 (FIG. 4(a)) are welded to the metallised contact pads 2 of an integrated circuit contained on a semi-conductor device 3. The conductors are of copper and the intervening material is a piece of 38 μm steel shim foil 15 and a piece of 45 gsm paper 16, such that the wheel rubs on the top surface of the steel shim and the paper lies between the laminate and the steel shim. Following the welding operation the steel shim and paper layers may be removed leaving an array of conductors welded to corresponding pads on the I.C. (FIG. 4(b)).

The welds are made at a linear speed of 200 mm/sec using a ceramic wheel of 12 mm diameter rotating at 80,000 rpm. These conditions allow continuous welding without short circuiting of the conductors. The conductors may be as close together as 50 μm, representing a very high rate of four connections per millisecond. In addition the pad area required for such welds may be less than the 100×100 μm required for conventional welds, 100×50 μm pad areas being sufficient to weld circuit tracks of rectangular cross sections of 100×12.5 μm.

Example 5

Figure 5A:
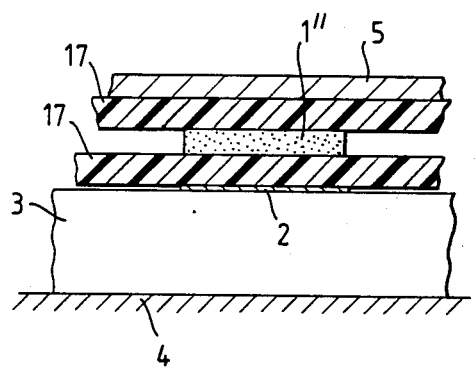
Figure 5B:
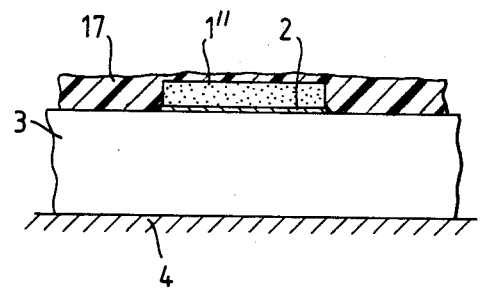

In this example the interconnection element is of a laminate comprising a circuit of aluminium conductors 1" (FIG. 5) sandwiched between two layers of polyester film 17 and the conductors of the element are welded to the metallised contact pads 2 of an I.C. contained on a semi-conductor device such as a silicon chip 3.

When the conductors are positioned above the corresponding contact pads 2 an intervening layer 5 is placed over the interconnection element. Welding takes place as described in Example 4 but with a layer of polyester being left over the conductors and the intervening layer is then removed. The advantage of this particular assembly (FIG. 5(b)) is that the film of polyester on each exposed face of the conductors affords greater environmental protection to the conductors than is the case in Example 4.

The conductors may equally well be of copper.

Example 6

In this example the gold coated copper conductors 1" of an interconnection element are laminated between a film of polyester 7 and a film of a polyimide 6 and are welded to conductive tracks 8 contained within a chip carrier or package 9 in order to electrically interconnect to a semi-conductor of the package.

A semi-conductor device is often contained in a special carrier or package which may be of ceramic, and which contains metallic conductor tracks of an alloy such as Kovar plated with gold or another metal. The conductor tracks are designed to lie outside the package to enable the complete package to be connected to a printed circuit board and to lie inside the package to allow bridging electrical connections to be made to the corresponding pads in the integrated circuit. In the region where the electrical connections are to be made, the conductor tracks may have a rectangular cross section of 100 $\mu$m $\times$ 50 $\mu$m.

Figure 6A:
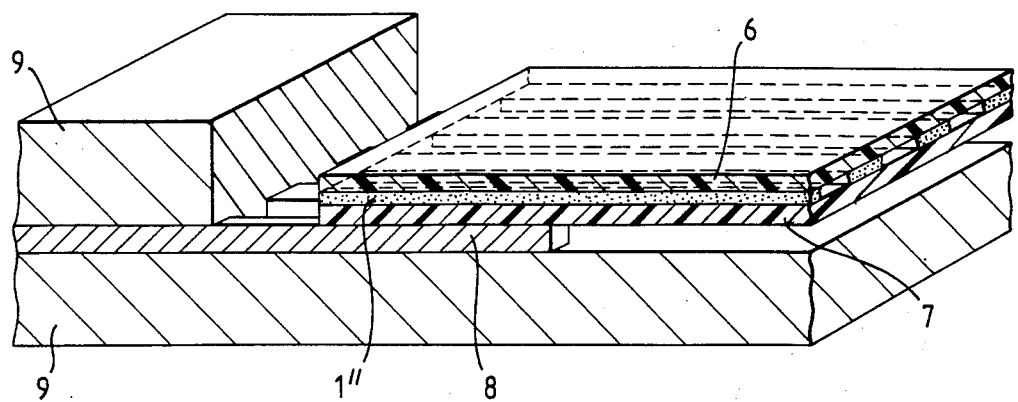
FIG. 6(a) is a perspective view and FIG. 6(b) is a side sectional view.
Figure 6B:
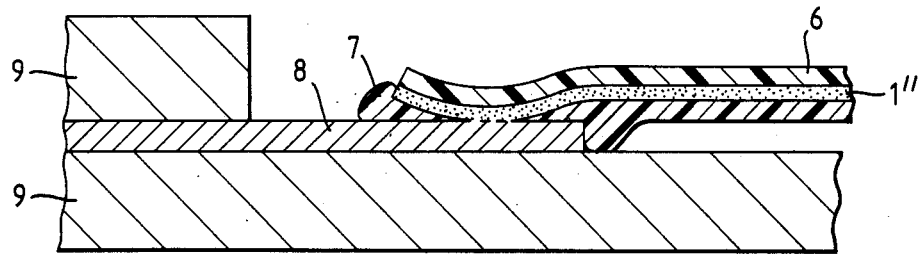
Figure 7A:
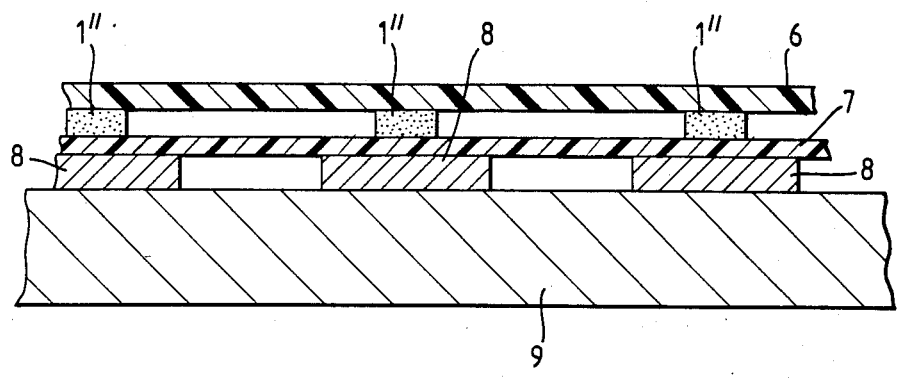
FIGS. 7(a) and (b) are sectional views taken at right angles to FIGS. 6(a) and (b), of an array of conductors and contact areas before and after loading.

In this example, the interconnection element is exactly as described in Example 3, and may have already been connected to an integrated circuit. A process as described in that Example may have been used for that connection also. The conductors 1" of the interconnection element are positioned in register above the conductor tracks 8 (FIGS. 6(a) and 7(a)) inside the package 9 with the polyester face 7 of the interconnection element in contact with them. A wheel of 25 mm diameter and a width at its circumference of 40 $\mu$m rotating at a speed of 40,000 rpm is brought into contact with the polyimide surface and is moved over the surface in the direction of the arrow A, FIG. 7(b) such that its linear speed is approximately 300 m/sec and it passes directly above each pair of superimposed conductors in turn. This causes a weld with good electrical conductivity to be formed between each corresponding pair of conductors (FIGS. 6(b) and 7(b)).

The interconnection element (for example a leadframe) may then be connected to conductor tracks on a printed circuit board. At the relevant position the conductors in the laminate may have a rectangular cross section of 1 mm $\times$ 25 $\mu$m and the conductor tracks on the printed circuit board may have a rectangular cross section of 1 mm $\times$ 75 $\mu$m.

The laminate is positioned with its polyester face 7 in contact with the printed circuit board and its conductor tracks in register with the corresponding conductor tracks on the printed circuit board.

Figure 7B:
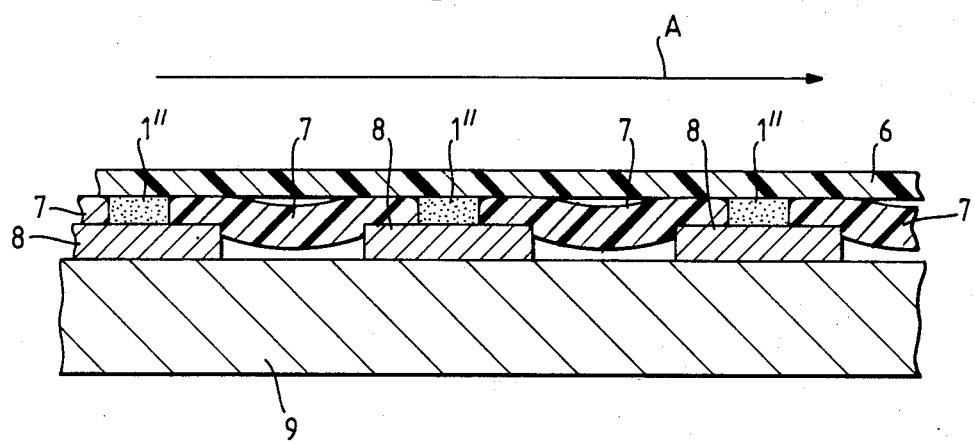

A wheel with a thickness at its edge of 100 $\mu$m and a diameter of approx 30 mm, rotating at 35,000 rpm is brought into contact with the polymide surface of the laminate is caused to move at a linear speed of 500 mm/sec over each superimposed pair of conductors in turn. This causes a weld with good electrical conductivity to be formed between each corresponding pair of conductors exactly as shown in FIG. 7(b), electrically interconnecting the semi-conductor device with the printed circuit board through the interconnection element.

What is claimed is:

1. An electrical assembly comprising a circuit component and at least one conductor device external of the circuit component, the circuit component including at least one metal contact element, the conductor device including a laminate of a metal strip and a layer of insulant material having one surface contiguous with the metal strip and the other surface adjacent the metal contact element, a first surface of the metal strip adjacent the metal contact element being bonded thereto to form an electrical connection by a friction bonding process in which a rotating surface portion of a rotating friction wheel is placed in contact with an exposed surface of an additional layer overlying a second surface of the metal strip opposite the first surface, a portion of the insulant material disposed between the metal strip and the metal contact element being displaced from between the metal strip and the metal contact element by the friction bonding process so as to expose the one surface of the metal strip adjacent the metal contact element to enable bonding of the metal strip to the metal contact element.

2. An assembly according to claim 1 wherein the additional layer constitutes another layer of insulant material permanently attached to the metal strip and included in the laminate.

3. An assembly according to claim 2 wherein the materials of the layers of insulant material are different from one another.

4. An assembly according to claim 3 wherein the material of the layer of insulant material adjacent the metal contact pad is polyester and wherein the material of the other layer is polyimide.

5. An assembly according to claim 4 wherein the circuit component is a semiconductor chip.

6. An assembly according to claim 4 wherein the circuit component is a chip carrier.

7. An assembly according to claim 1 wherein the layer of insulant material is polyester.

8. An assembly according to claim 7 wherein the additional layer is a steel shim foil removable from the laminate upon the bonding of the metal strip to the contact element.

9. An assembly according to claim 8 wherein the circuit component is a semiconductor chip.

10. An assembly according to claim 1 wherein the laminate includes another layer of insulant material on a side of the metal strip opposite the contact element, the other layer of insulant material being disposed between the metal strip and the additional layer during the friction bonding process.

11. An assembly according to claim 10 wherein the material of each layer of insulant material is polyester and wherein the additional layer is a glass cloth removable from the laminate upon the bonding of the metal strip to the contact pad.

12. An assembly according to claim 11 wherein the circuit component is a semiconductor chip.

13. An assembly according to claim 1 wherein the material of the layer of insulant material is polyester.

14. An assembly according to claim 1 wherein the circuit component is a semiconductor chip.

15. An assembly according to claim 1 wherein the circuit component is a chip carrier.

16. An electrical assembly comprising a circuit component and at least one conductor device external of the circuit component, the circuit component including a plurality of metal contact elements, the conductor device including a laminate of a plurality of metal strips and a layer of insulant material having one surface contiguous with the metal strips and the other surface adjacent the metal contact elements, the metal strips being aligned with respective ones of the metal contact elements, a first surface of each of the metal strips adjacent the respective metal contact elements being bonded thereto to form electrical connections by a friction bonding process in which a rotating surface portion of a rotating friction wheel is placed in contact with an exposed surface of an additional layer overlying a second surface of each of the metal strips opposite the respective first surface, each portion of the insulant material disposed between one of the metal strips and the metal contact element adjacent thereto being displaced from between the metal strip and the metal contact element by the friction bonding process so as to expose the one surface of each of the metal strips adjacent the metal contact elements to enable bonding of the metal strips to the metal contact elements.

* * * * *